(12) United States Patent
Lam

(10) Patent No.: US 7,482,867 B2
(45) Date of Patent: Jan. 27, 2009

(54) SINGLE STAGE BALANCED VOLTAGE AMPLIFIER

(76) Inventor: Chi Ming John Lam, Flat B, 7/F, Tower 3, Vista Paradiso, Ma On Shan, Shatin, New Territories (HK)

( * ) Notice: Subject to any disclaimer, the term of this patent is extended or adjusted under 35 U.S.C. 154(b) by 70 days.

(21) Appl. No.: 11/748,508

(22) Filed: May 15, 2007

(65) Prior Publication Data

US 2007/0296492 A1 Dec. 27, 2007

(30) Foreign Application Priority Data

Jun. 13, 2006 (GB) .................................. 0611662.8

(51) Int. Cl.
*H03F 3/45* (2006.01)
(52) U.S. Cl. ......................................... 330/69; 330/252
(58) Field of Classification Search ................... 330/69, 330/252, 260, 261, 41, 42, 43, 44
See application file for complete search history.

(56) References Cited

U.S. PATENT DOCUMENTS 2,543,819 A 3/1951 Williams
3,132,307 A 5/1964 Augustine et al.
3,293,558 A * 12/1966 Walton ......................... 330/69
4,134,077 A * 1/1979 Kelly et al. .................... 330/69
7,304,535 B2 * 12/2007 Lam ............................. 330/69

FOREIGN PATENT DOCUMENTS

GB          579685   A1   8/1946

* cited by examiner

*Primary Examiner*—Henry K Choe
(74) *Attorney, Agent, or Firm*—William J. Sapone; Coleman Sudol Sapone P.C.

(57) ABSTRACT

A balanced voltage amplifier is disclosed as comprising a single stage containing three pairs of vacuum tube triodes configured to amplify two input signals (+INPUT, −INPUT) and to generate two output signals (+OUTPUT, −OUTPUT). The balanced voltage amplifier offers high voltage gain, wide bandwidth and low output impedance. Local feedback may be applied between the outputs and the second pair of triodes. Overall feedback may be applied between the outputs and the first pair of triodes. If local or overall feedback is used, it will further broaden the bandwidth, lower the output impedance and improve the overall balancing.

14 Claims, 5 Drawing Sheets

SINGLE STAGE BALANCED VOLTAGE AMPLIFIER

This invention relates to a balanced voltage amplifier and, in particular, a single stage balanced voltage amplifier containing three pairs of vacuum tubes.

A balanced amplifier has two inputs (+INPUT, −INPUT) and two outputs (+OUTPUT, −OUTPUT). The differential outputs are proportional to the differential inputs by a proportional constant called signal gain (or voltage gain). In addition, a balanced amplifier tends to cancel out the common mode noises and distortions. The result is a lower noise and low distortion amplifier compared with singled-end input or singled-end output amplifiers. Given this advantage, balanced amplifiers have been extensively used in communication electronics.

In the past few decades, balanced amplifiers can also be found for use in high-end solid-state semiconductor audio power amplifiers and low-level line amplifiers. In the former, balanced power amplifiers are used while, in the latter, balanced voltage amplifiers are used. Vacuum tube devices can also be employed to implement balanced power and voltage amplifiers. At present there are two common vacuum tube balanced voltage amplifiers, the circuit arrangements of which being shown in FIGS. 4 and 5.

The circuit arrangement shown in FIG. 4 is usually referred to as the "long-tail pair", or simply differential amplifier. When a triode in such an arrangement is replaced by two triodes in "cascode" configuration, a cascode differential amplifier is formed, as shown in FIG. 5. If the vacuum tube triode pairs V1$a$, V1$b$; V2$a$, V2$b$ and resistor pairs R9, R10; R11, R12; R17, R18 are carefully matched, a balanced voltage amplifier can be built. The balanced voltage amplifier in FIG. 5 has a higher signal gain and broader bandwidth than the one in FIG. 4. In general, low output impedance is also another desirable feature sought in voltage amplification.

Roughly speaking, the resistors R17, R18 determine the signal gain and the output impedance of the balanced voltage amplifier of FIG. 4, and the resistors R9, R10 have the same function for the balanced voltage amplifier of FIG. 5. Given a high resistor value, the result is a high signal gain (desirable) and high output impedance (not desirable). Therefore, it is always a trade-off between achieving high signal gain and low output impedance.

Although balanced voltage amplifiers with similar high signal gain, broad bandwidth and low output impedance are easier to build by cascading multiple conventional balanced voltage amplifiers, as there is always a certain degree of phase shift associated with an amplifier, by cascading multiple amplifiers, the cumulated phase shifts will reduce the phase margin of the overall amplifier. There is therefore always a concern of instability with multiple stage amplifiers when global feedback is applied.

It is thus an object of the present invention to provide a single stage balanced voltage amplifier in which the aforesaid shortcomings are mitigated, or at least to provide a useful alternative to the public.

In particular, it is an object of the present invention to provide a single stage balanced voltage amplifier to meet the goal of achieving a high signal gain while keeping the output impedance low.

According to the present invention, there is provided a balanced voltage amplifier including a single stage containing at least a first, a second and a third pair of vacuum tube triodes for amplifying two input signals and generating two output signals.

Preferably, said input signals may be fed to the grids of said first pair of vacuum tube triodes, and a grid resistor may be connected to ground on each triode to maintain proper DC biasing.

Advantageously, outputs of said first pair of triodes taken from the plates may be fed to the cathodes of said second pair of triodes, and including a plurality of resistors to set up a pre-determined DC biasing voltage at the grid of said second pair of triodes.

Suitably, bypass capacitors may be connected from the grid of said second pair of triodes to ground.

Outputs of said second pair of triodes taken from the plates may advantageously be fed to the cathodes of said third pair of triodes via two series resistors.

Each of said third pair of triodes may preferably be self-biased by a voltage potential created by a first resistor in series from the cathode, and fed to the grid of each of said third pair of triodes.

The amplifier may suitably include a second resistor in series with said first resistor.

Advantageously, outputs may be taken from the cathodes of said third pair of triodes via a plurality of coupling capacitors.

Preferably, two fixed resistors and a variable resistor may be connected between the cathodes of said first pair of triodes with the variable resistor placed in the middle.

Suitably, said two fixed resistors may be provided for determining the voltage gain.

Said variable resistor may advantageously be of a small value and provided for fine adjusting the balancing of the amplifier.

A resistor or a constant current source may suitably be connected from the middle tap of said variable resistor to a negative power supply.

Said constant current source may conveniently comprise a JFET, MOSFET, BJT, a vacuum tube triode, a pentode with complementary zener diode and resistors, or a resistor.

Local feedback may preferably be applied between the outputs of said third pair of triodes and the grids of said second pair of triodes.

Advantageously, said local feedback may be provided by an RC network.

Suitably, overall feedback may be applied between the outputs of the third pair of triodes and the crossed cathodes of said first pair of triodes.

Said overall feedback may conveniently be provided by an RC network

Embodiments of the present invention will now be described, by way of examples only, with reference to the accompanying drawings, in which.

Figure 1:
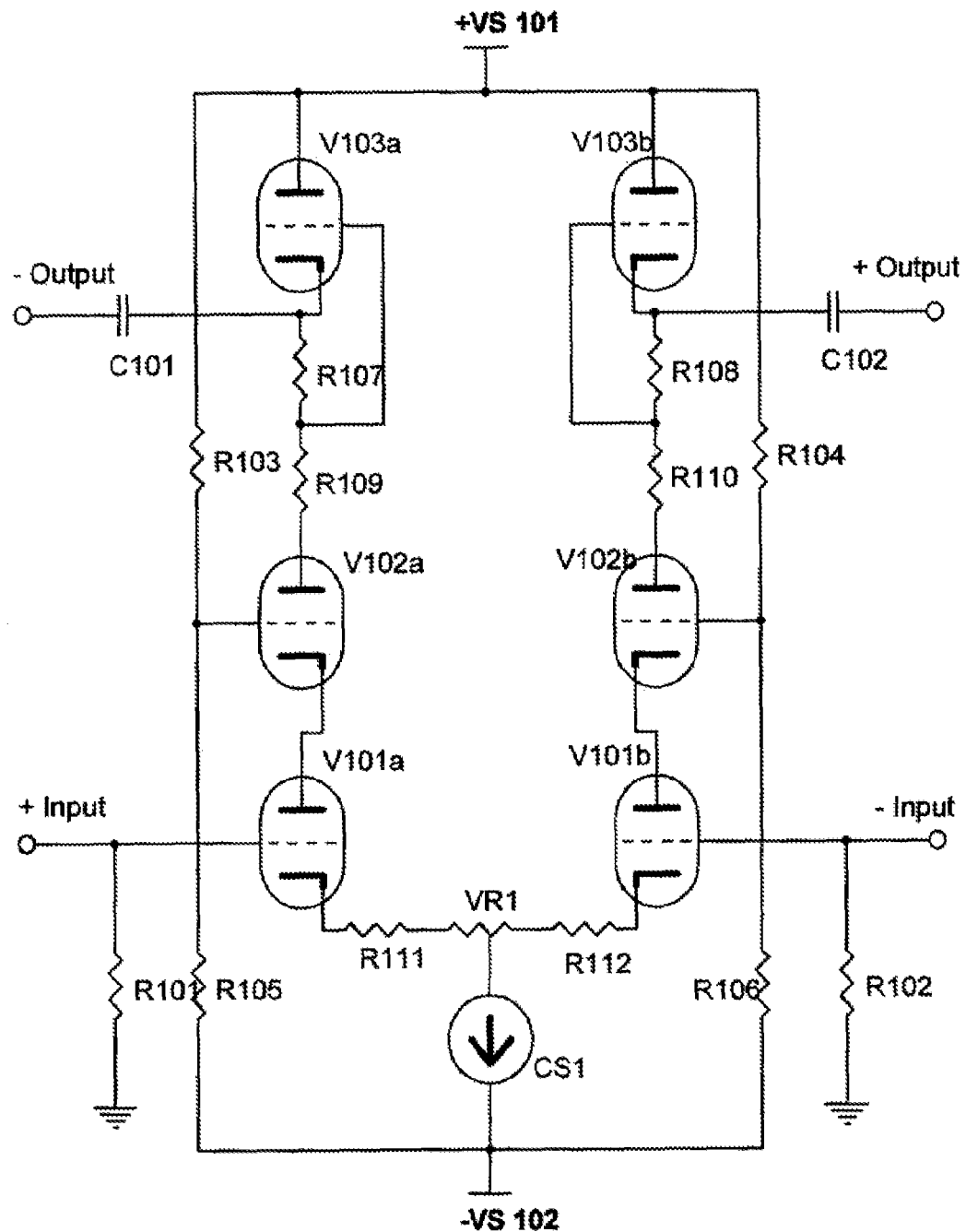
FIG. 1 shows a circuit diagram of a single stage balanced voltage amplifier according to a first embodiment of the present invention.

As shown in FIG. 1, a first embodiment of a balanced voltage amplifier according to the present invention is realized in the form of a single-stage amplifier containing three pairs of vacuum tubes V101a, V101b; V102a, V102b; V103a, V103b. The vacuum tubes V101a, V101b; V102a, V102b; V103a, V103b can be any of the commonly used small signal vacuum tube triodes, such as 12AT7, 12AU7, 12AX7, 6DJ8, 6SN7, 6SL7, 6H30P, and the like. However, if low output impedance is a key wanted feature, vacuum tubes with low plate impedance, such as 6DJ8 and 6H30P, should be used.

The input signals (+INPUT, −INPUT) are fed to the first pair of vacuum tube triodes V101a, V101b. The outputs of these vacuum tube triodes V101a, V101b are then fed to the cathodes of the second pair of triodes V102a, V102b. The resistor networks formed by resistors R103, R104, R105, R106 set up a correct DC biasing voltage at the grid of the second pair of triodes V102a, V102b. The output of the second pair of triodes V102a, V102b are taken from the plates and fed to the cathodes of the third pair of triodes V103a, V103b via resistors R107, R108, R109, R110. The purpose of resistors R109, R110 is to improve the DC biasing stability of the whole balanced voltage amplifier.

It should be noted that bypass capacitors may be connected from the grid of triodes V102a, V102b to ground to filter out noises generated from the power supplies that might be amplified by the triodes. However, as long as the voltage supplies +VS101 and −VS102 are properly regulated and filtered, bypass capacitors may be omitted.

The third pair of triodes V103a, V103b are self-biased by the voltage potential, which is created by cathode resistors R107, R108, and is fed to the grid of the triodes V103a, V103b. The outputs are taken from the cathodes of the triodes V103a, V103b via coupling capacitors C101, C102 respectively. As the output impedance at the cathode of a triode is low, the output impedance of the overall balanced voltage amplifier is kept low. The resistors R111, R112 set the overall signal gain. A small value variable resistor VR1 is optionally used for fine adjusting the overall balancing, although it should be understood that such a variable resistor is not an essential feature.

The constant current source CS1 may be easily implemented by the use of solid-state semiconductor devices such as junction gate field-effect transistor (JFET), bipolar junction transistor (BJT) or metal-oxide-semiconductor field-effect transistor (MOSFET) with complementary components zener diode and resistors. In some practical situations, a simple resistor can replace the current source. However, a constant current source will generally improve the common-mode-rejection-ratio (CMRR) of the overall balanced voltage amplifier.

Figure 2:
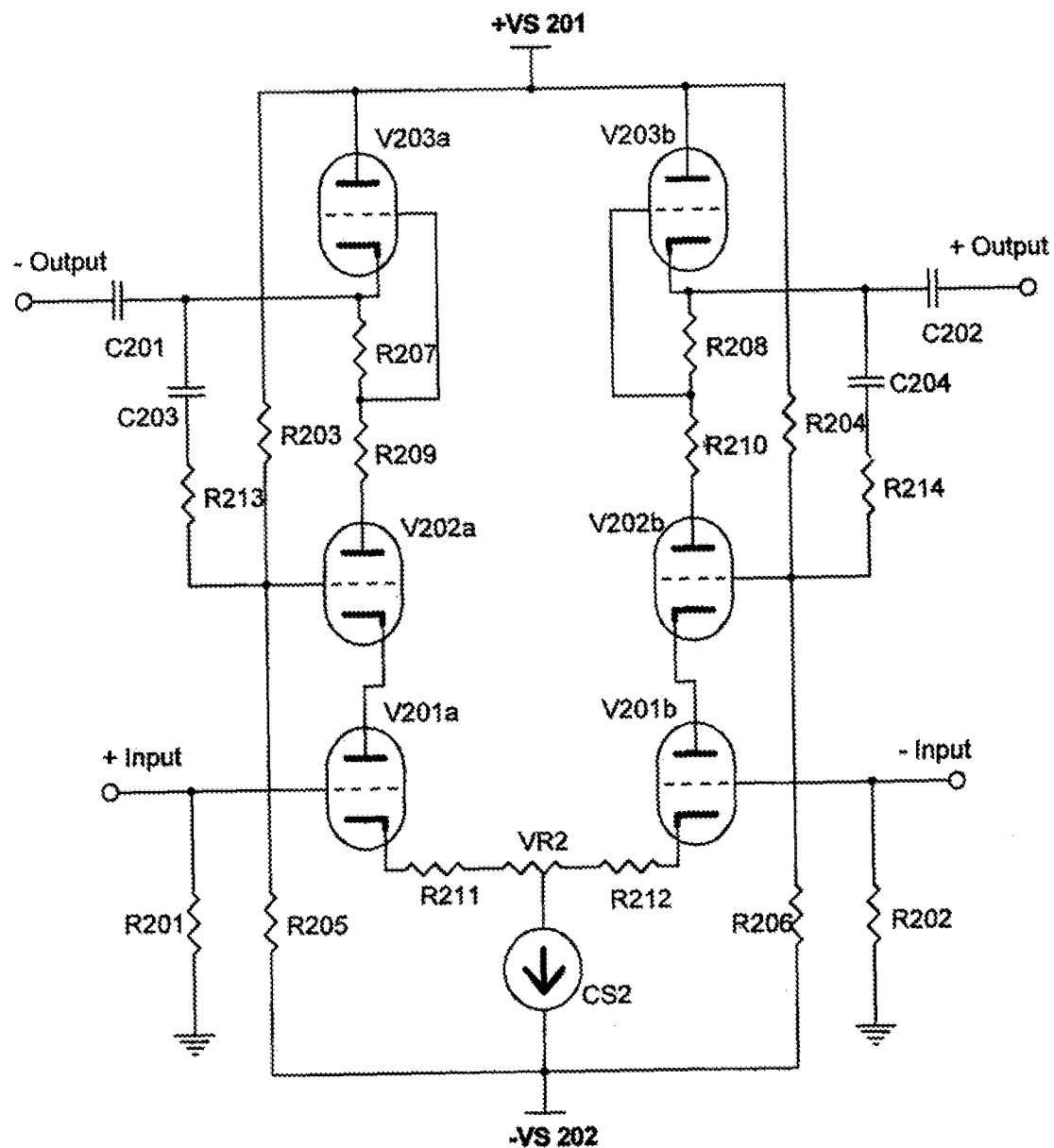
FIG. 2 shows a circuit diagram of a single stage balanced voltage amplifier according to a second embodiment of the present invention, being a modified arrangement of the arrangement shown in FIG. 1, in which local feedback is applied between the output and the second pair of vacuum tubes.

If some local feedback is used, the bandwidth will be broadened and the output impedance may be further lowered. FIG. 2 reveals such an arrangement, according to a second embodiment of the present invention. It can be seen that this circuit arrangement also includes three pairs of vacuum tube triodes V201a, V201b; V202a, V202b; V203a, V203b. The outputs of the third pair of triodes V203a, V203b are fed to the gates of the second pair of triodes V202a, V202b via RC networks C203, R213; C204, R214.

Figure 3:
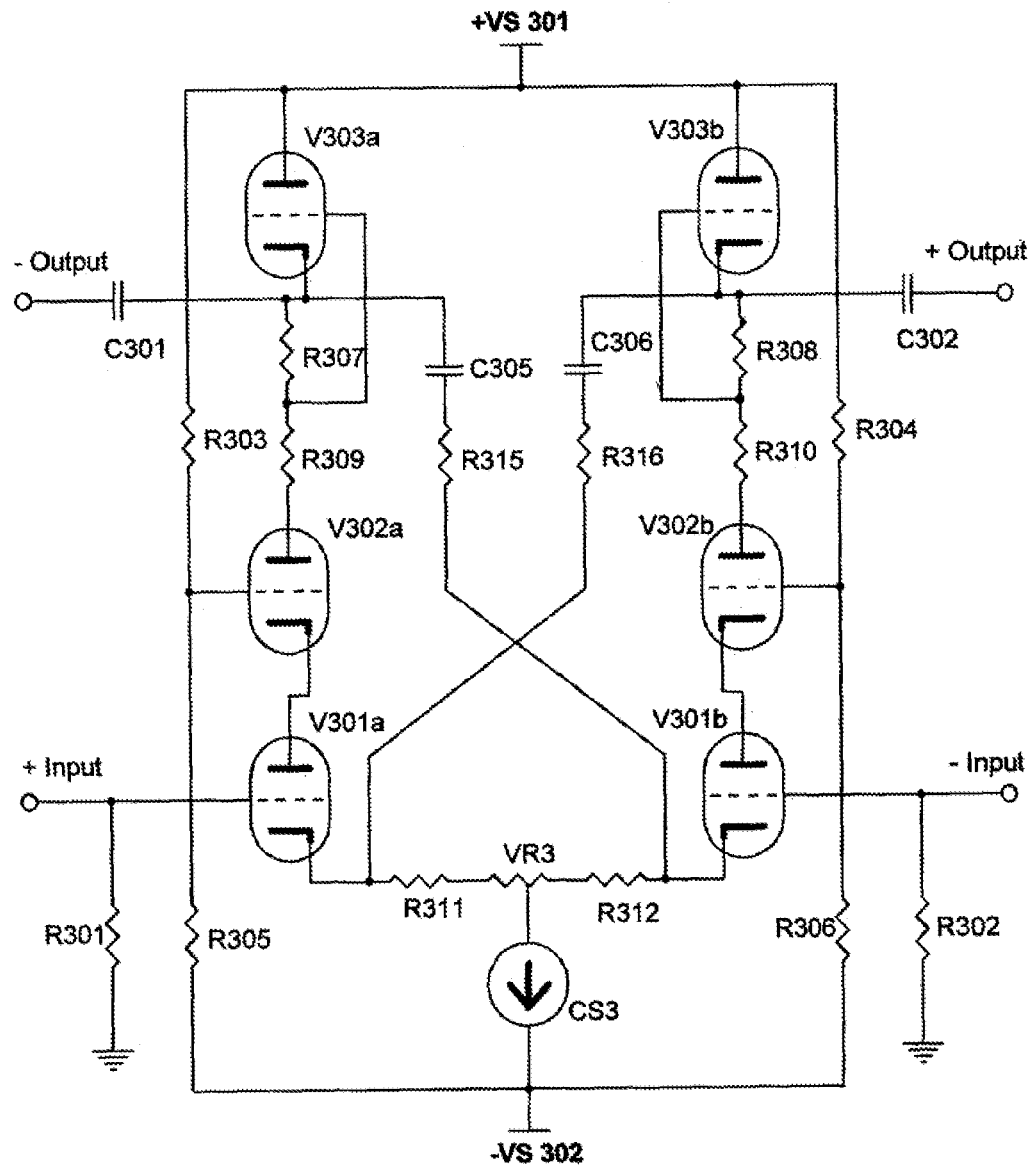
FIG. 3 shows a circuit diagram of a single stage balanced voltage amplifier according to a third embodiment of the present invention, being a further modified arrangement of the arrangement shown in FIG. 1, in which overall feedback is applied between the output and the first pair of vacuum tubes.
Figure 4:
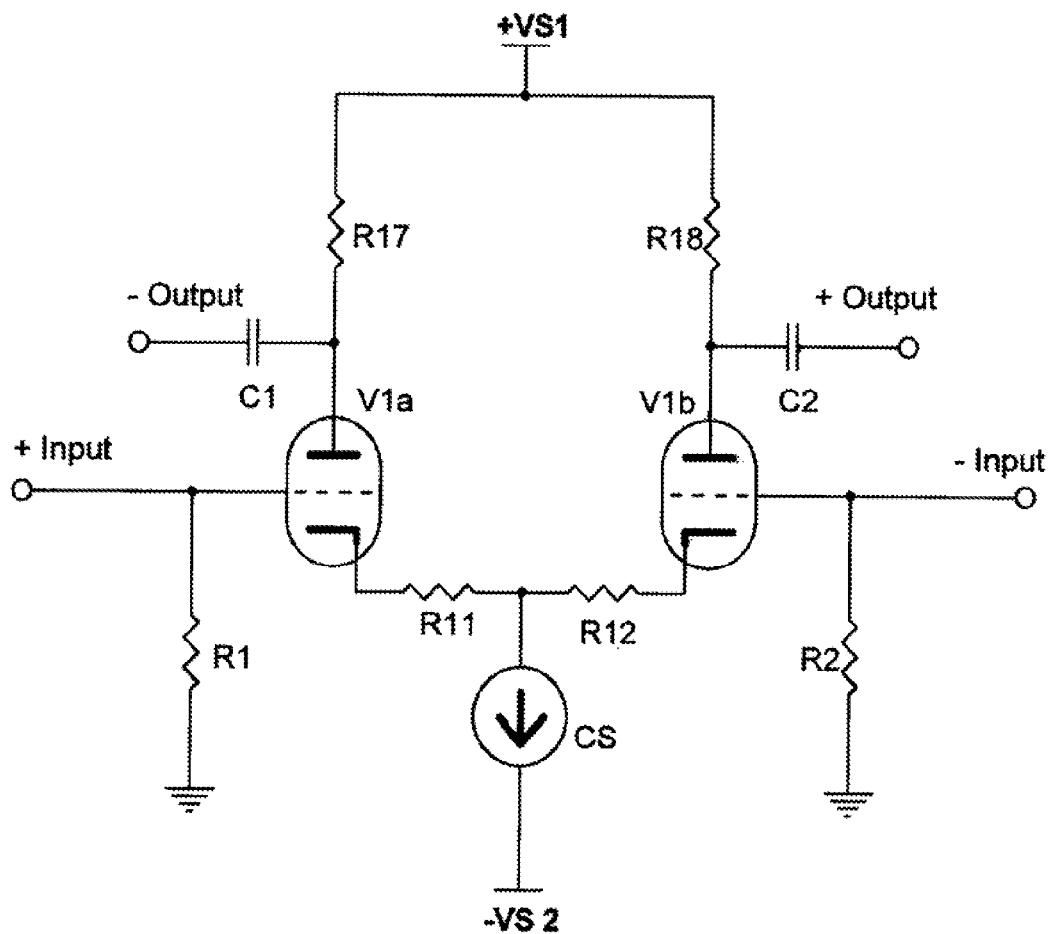
FIG. 4 shows a circuit diagram of a conventional balanced amplifier, namely a differential amplifier.
Figure 5:
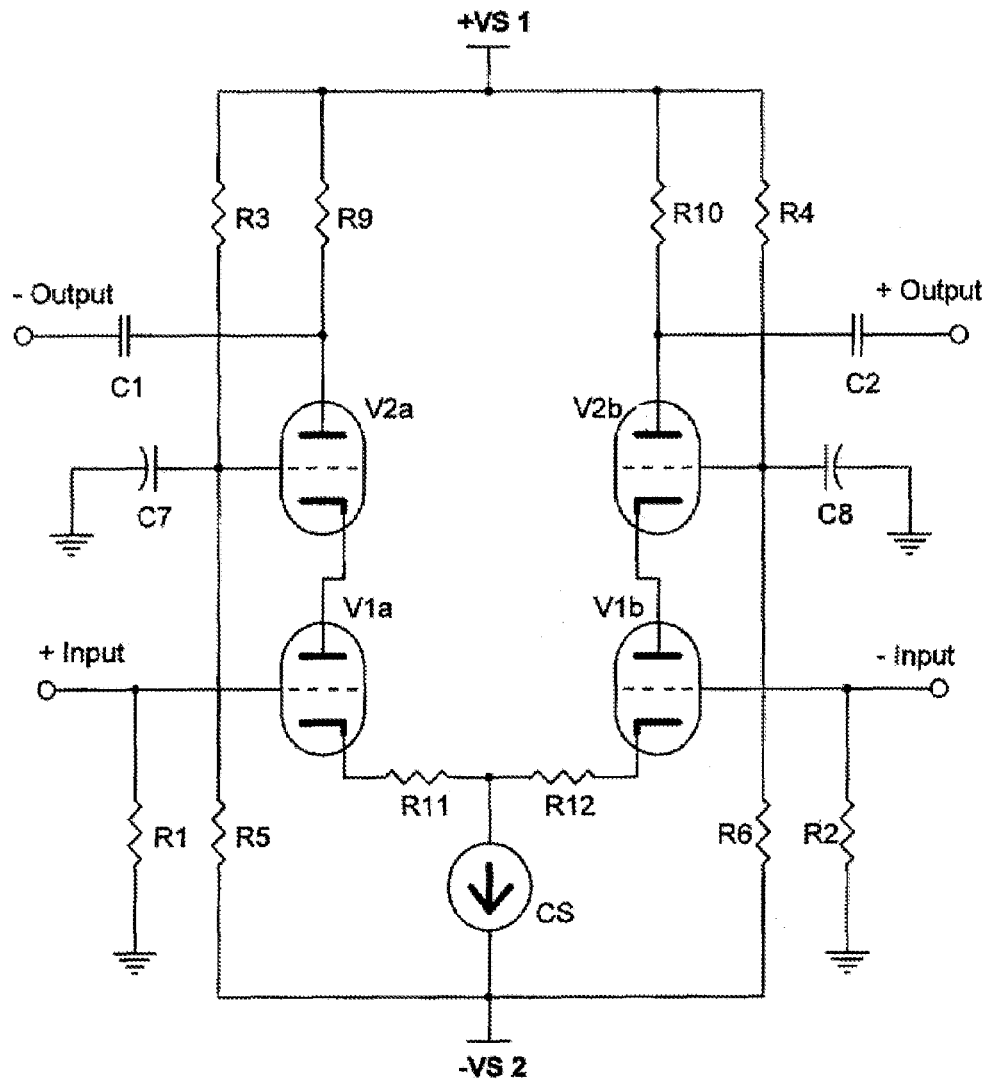
FIG. 5 shows a circuit diagram of an improved conventional balanced voltage amplifier, namely a cascode differential amplifier.

FIG. 3 shows a further circuit arrangement of a balanced voltage amplifier according to a third embodiment of the present invention, in which overall feedback is applied to the amplifier. Again, this circuit arrangement also includes three pairs of vacuum tube triodes V301a, V301b; V302a, V302b; V303a, V303b. It can be seen that the outputs of the third pair of triodes V303a, V303b are fed to the crossed cathodes of the first pair of triodes V301a, V301b via RC networks C305, R315; C306, R316. With the use of overall feedback, it will not only broaden the overall bandwidth and lower the output impedance, but will also reduce the sensitivity of parameters change of vacuum tubes V301a, V301b; V302a, V302b; V303a, V303b due to aging. The overall balancing can be also improved.

With the present invention, as shown in FIGS. 1 to 3, new balanced voltage amplifiers with high signal gain and low output impedance can be formed by three pairs of vacuum tube triodes confined in a single stage.

It should be understood that the above only illustrates examples whereby the present invention may be carried out, and that various modifications and/or alterations may be made thereto without departing from the spirit of the invention.

It should also be understood that certain features of the invention, which are, for clarity, described in the context of separate embodiments, may be provided in combination in a single embodiment. Conversely, various features of the invention which are, for brevity, described in the context of a single embodiment, may also be provided separately or in any appropriate sub-combinations.

The invention claimed is:

1. A single stage balanced voltage amplifier containing at least a first, a second and a third pair of vacuum tube triodes for amplifying two input signals and generating two output signals, wherein outputs of said first pair of triodes taken from the plates are fed to the cathodes of said second pair of triodes, further including a plurality of resistors to set up a pre-determined DC biasing voltage at the grid of said second pair of triodes, and wherein bypass capacitors are connected from the grid of said second pair of triodes to ground.

2. A single stage balanced voltage amplifier containing at least a first, a second and a third pair of vacuum tube triodes for amplifying two input signals and generating two output signals, wherein said input signals are fed to the grids of said first pair of vacuum tube triodes, and a grid resistor is connected to ground on each triode to maintain proper DC biasing, and wherein outputs of said second pair of triodes taken from the plates are fed to the cathodes of said third pair of triodes via two series resistors.

3. A single stage balanced voltage amplifier according to claim 2 wherein each of said third pair of triodes is self-biased by a voltage potential created by a first resistor in series from the cathode, and fed to the grid of each of said third pair of triodes.

4. A single stage balanced voltage amplifier according to claim 3 further including a second resistor in series with said first resistor.

5. A single stage balanced voltage amplifier according to claim 4 wherein outputs are taken from the cathodes of said third pair of triodes via a plurality of coupling capacitors.

6. A single stage balanced voltage amplifier according to claim 5 wherein two fixed resistors and a variable resistor are connected between the cathodes of said first pair of triodes with the variable resistor placed in the middle.

7. A single stage balanced voltage amplifier of claim 6 wherein said two fixed resistors are provided for determining the voltage gain.

8. A single stage balanced voltage amplifier according to claim 6 wherein said variable resistor is of a small value and is provided for fine adjusting the balancing of the amplifier.

9. A single stage balanced voltage amplifier according to claim 6 wherein a resistor or a constant current source is connected from the middle tap of said variable resistor to a negative power supply.

10. A single stage balanced voltage amplifier according to claim 9 wherein said constant current source comprises a JFET, MOSFET, BJT, a vacuum tube triode, a pentode with complementary zener diode and resistors, or a resistor.

11. A single stage balanced voltage amplifier containing at least a first, a second and a third pair of vacuum tube triodes for amplifying two input signals and generating two output signals, and wherein local feedback is applied between the outputs of said third pair of triodes and the grids of said second pair of triodes.

12. A single stage balanced voltage amplifier according to claim 11 wherein said local feedback is provided by an RC network.

13. A single stage balanced voltage amplifier containing at least a first, a second and a third pair of vacuum tube triodes for amplifying two input signals and generating two output signals, and wherein overall feedback is applied between the outputs of the third pair of triodes and the crossed cathodes of said first pair of triodes.

14. A single stage balanced voltage amplifier according to claim 13 wherein said overall feedback is provided by an RC network.

\* \* \* \* \*